United States Patent
Lee et al.

(10) Patent No.: US 8,106,473 B2
(45) Date of Patent: Jan. 31, 2012

(54) GERMANIUM FILM OPTICAL DEVICE

(75) Inventors: Jong-Jan Lee, Camas, WA (US); Steven R. Droes, Camas, WA (US); John W. Hartzell, Camas, WA (US); Jer-Shen Maa, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 13/050,689

(22) Filed: Mar. 17, 2011

(65) Prior Publication Data

US 2011/0163404 A1 Jul. 7, 2011

Related U.S. Application Data

(62) Division of application No. 12/434,118, filed on May 1, 2009, now Pat. No. 7,927,909.

(51) Int. Cl.
*H01L 27/146* (2006.01)
*H01L 31/068* (2006.01)

(52) U.S. Cl. ............... 257/443; 257/461; 257/E27.133; 257/E31.032

(58) Field of Classification Search .......... 257/443, 257/461, E27.133, E31.032
See application file for complete search history.

(56) References Cited

U.S. PATENT DOCUMENTS

| | | |
|---|---|---|
| 6,645,831 B1 | 11/2003 | Shaheen et al. |
| 7,019,339 B2 | 3/2006 | Atwater et al. |
| 7,157,300 B2 | 1/2007 | Lee et al. |
| 7,358,107 B2 | 4/2008 | Maa et al. |
| 2008/0121805 A1 | 5/2008 | Tweet et al. |

*Primary Examiner* — Matthew W Such
*Assistant Examiner* — Monica D Harrison
(74) *Attorney, Agent, or Firm* — Law Office of Gerald Maliszewski; Gerald Maliszewski (57) ABSTRACT

A germanium (Ge) photodiode array on a glass substrate is provided with a corresponding fabrication method. A Ge substrate is provided that is either not doped or lightly doped with a first dopant. The first dopant can be either an n or p type dopant. A first surface of the Ge substrate is moderately doped with the first dopant and bonded to a glass substrate top surface. Then, a first region of a Ge substrate second surface is heavily doped with the first dopant. A second region of the Ge substrate second surface is heavily doped with a second dopant, having the opposite electron affinity than the first dopant, forming a pn junction. An interlevel dielectric (ILD) layer is formed overlying the Ge substrate second surface and contact holes are etched in the ILD layer overlying the first and second regions of the Ge substrate second surface. The contact holes are filled with metal and metal pads are formed overlying the contact holes.

10 Claims, 6 Drawing Sheets

GERMANIUM FILM OPTICAL DEVICE

RELATED APPLICATIONS

This application is a Divisional of a patent application entitled, GERMANIUM FILM OPTICAL DEVICE FABRICATED ON A GLASS SUBSTRATE, invented by Jong-Jan Lee et al., Ser. No. 12/434,118, filed May 1, 2009 now U.S. Pat. No. 7,927,909. This application is incorporated herein by reference.

BACKGROUND OF THE INVENTION

1. Field of the Invention

This invention generally relates to a germanium (Ge) imaging device and, more particularly, to a Ge optical device fabricated on a glass substrate.

2. Description of the Related Art

There is a great deal of interest in devices fabricated on Ge wafers, including CMOS devices, optical sensors, and imagers. For example, the use a Ge film permits an imager to work in a different spectrum of wavelengths than a silicon-based device. However, due to mismatched lattices and differences in thermal expansion, it is difficult to integrate Ge films into conventional silicon-based integrated circuit (IC) fabrication processes.

Although more costly to manufacture, optical sensing devices can be made on a Ge substrate. Then, the more conventional read-out and drive circuitry can be fabricated in silicon (Si), the Si substrate bonded to the Ge substrate, and the Ge optical sensors electrically connected to the Si substrate read-out circuitry. For handling purposes these substrates are typically relatively thick. However, many Ge-based devices need only be fabricated on thin films, and in some cases a thick Ge substrate degrades Ge device performance.

In U.S. Pat. No. 7,358,107, a germanium film is selectively epitaxially grown on a Si wafer with built-in devices. Although the process is low in cost and it is straight forward to integrate the Ge devices on Si wafer, the integration of the Ge device may affect the Si device characteristics. Another issue with this technology is the Ge film quality. Although the overgrown Ge film quality is much better than the Ge film directly grown on Si, devices fabricated on the overgrown Ge film cannot meet very strict requirements for reverse leakage current performance. PN junction diodes fabricated on selectively epitaxially grown Ge film or overgrown Ge film are well known to exhibit poor reverse leakage.

In U.S. Pat. No. 7,157,300, a germanium wafer is bonded to a Si CMOS wafer and subsequently split. Good quality germanium thin film can be transferred to the Si CMOS wafer using this process. However, the Ge thickness is limited to 2-5 um and electrical connections between the bonded Ge film and the underlying Si CMOS devices are a challenge. The Ge device fabrication is constrained by the completion of Si CMOS prior to the Ge film transfer. For example, the maximum process temperature of the Ge device has to be lower than 400° C. due to the already formed Al interconnects.

In US Patent Publication 2008/0121805, Ge devices are fabricated on a Ge/Si wafer. Then, the Ge devices are flip chip bonded to Si CMOS ICs. In this approach, the Ge film is epitaxially grown on Si wafer. Due to the high mismatch between the Ge and Si lattices, defect-free Ge film on a Si wafer is very difficult to achieve.

A Ge wafer directly bonded to a Si wafer for device fabrication has also been suggested, for example, in U.S. Pat. No. 6,645,831. Initially, a thick Ge wafer is bonded to a Si wafer. Then, a significant amount of the Ge wafer is subsequently removed by polishing and etching. Finally, devices are fabricated in the remaining thin layer of Ge film on Si wafer. Although good quality germanium film can be formed using wafer direct bonding, the large difference in the thermal expansion coefficient between the Si and Ge results in the Ge film cracking or peeling during the device fabrication process.

It would be advantageous if devices could be fabricated on a high quality thin film of Ge and, subsequent to fabrication, electrically connected to circuitry in a Si substrate.

SUMMARY OF THE INVENTION

The device and fabrication process disclosed herein address the above-mentioned problem of fabricating devices in a high quality Ge thin-film, while integrating the Ge devices with conventionally fabricated silicon substrate circuitry. First, a Ge wafer is bonded on glass wafer and thinned, if necessary. Second, optical detecting devices are fabricated on the bonded pair. After an electrical connection is made to silicon substrate read-out circuitry, the glass substrate can be left in place, or split away from the Ge film.

Accordingly, a method is provided for fabricating a germanium (Ge) photodiode array on a glass substrate. A Ge substrate is provided that is either not doped or lightly doped with a first dopant. The first dopant can be either an n or p type dopant. A first surface of the Ge substrate is moderately doped with the first dopant and bonded to a glass substrate top surface. Then, a first region of a Ge substrate second surface is heavily doped with the first dopant. A second region of the Ge substrate second surface is heavily doped with a second dopant, having the opposite electron affinity than the first dopant, forming a pn junction. An interlevel dielectric (ILD) layer is formed overlying the Ge substrate second surface and contact holes are etched in the ILD layer overlying the first and second regions of the Ge substrate second surface. The contact holes are filled with metal and metal pads are formed overlying the contact holes.

In one aspect, the first and second regions of the Ge substrate second surface form an m column by n row array of pn photodiodes. Then, the metal pads of the pn photodiode array are bonded to electrical contacts on a silicon (Si) substrate read-out circuit having an array of pixel control elements arranged in m columns and n rows. Each pixel control element reads and resets a corresponding Ge photodiode. In another aspect, subsequent to bonding the metal pads to the electrical contacts of the silicon substrate photodiode read-out circuit, the glass substrate is removed. Alternately, since some types of glass are generally transparent in the same range of wavelengths as can be absorbed by Ge, the glass substrate can be left in place.

Additional details of the above-described method and a Ge film optical device are provided below.

DETAILED DESCRIPTION

Figure 1:
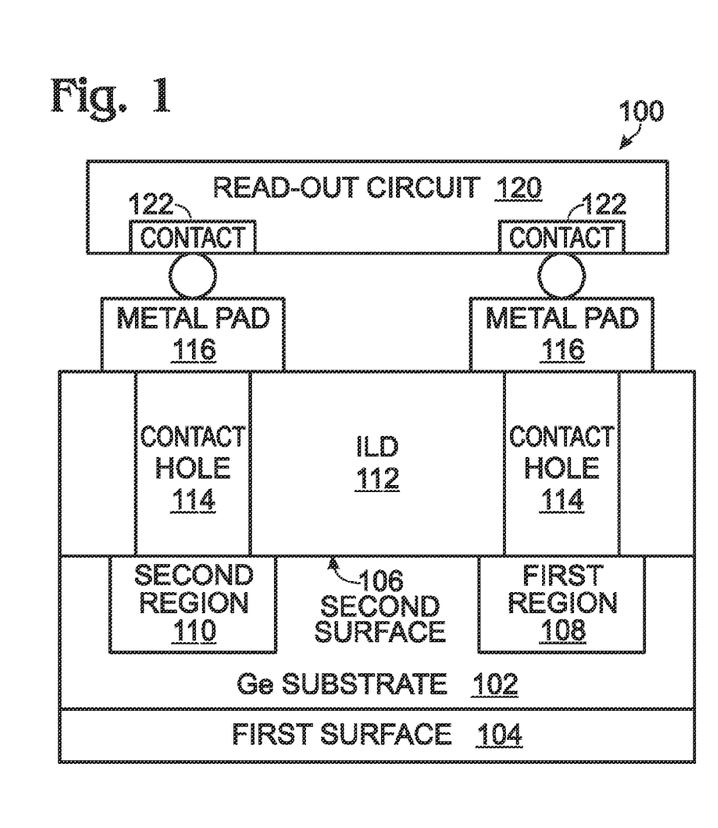
FIG. 1 is a partial cross-sectional view of a germanium (Ge) film optical device.

FIG. 1 is a partial cross-sectional view of a germanium (Ge) film optical device. The device 100 comprises a Ge substrate 102 that is either not doped or lightly doped with a first dopant. The first dopant is either an n or p type dopant. The Ge substrate 102 typically has a thickness 118 in the range of about 1 to 100 microns. The Ge substrate 102 has a first surface 104 moderately doped with the first dopant and a second surface 106 with a first region 108 heavily doped with the first dopant. Typically, the Ge substrate first surface 104 has a doping density in a range of $1\times10^{16}$ to $5\times10^{18}$ cm$^{-3}$.

The Ge substrate second surface 106 also includes a second region 110 heavily doped with a second dopant, having an opposite electron affinity than the first dopant. The combination of second region and underlying substrate form a pn junction. The first and second regions 108/110 of the Ge substrate second surface 106 each have doping densities in the range of $5\times10^{18}$ to $1\times10^{21}$ cm$^{-3}$. Note: the doping densities of the first and second regions need not necessarily be the same.

An interlevel dielectric (ILD) layer 112 overlies the Ge substrate second surface 106, with metal-filled contact holes 114 overlying the first and second regions 108/110 of the Ge substrate second surface 106, and metal pads 116 overlying the contact holes 114. A silicon substrate photodiode read-out circuit 120 has electrical contacts 122 bonded to the metal pads. The read-out circuitry typically consists of transistors that "read" the voltage or current of the second region 110 by passing the voltage or current to a data line. The read-out circuit may also include peripheral circuitry commonly associated with photodetector and imager devices.

Figure 2:
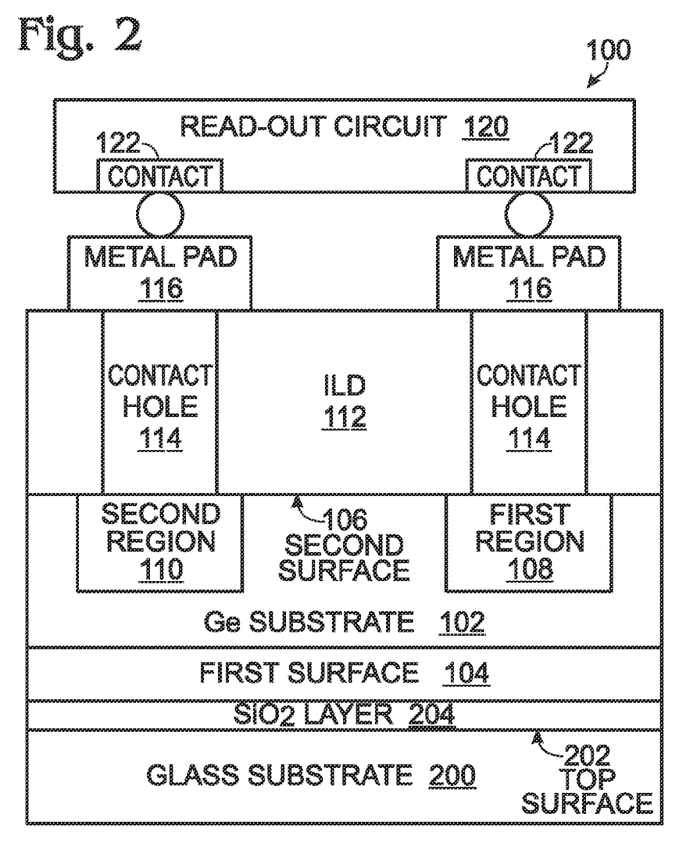
FIG. 2 is a partial cross-sectional view of a variation of the Ge film optical device depicted in FIG. 1.

FIG. 2 is a partial cross-sectional view of a variation of the Ge film optical device depicted in FIG. 1. In this aspect, a glass substrate 200 having a top surface 202 is bonded to the Ge substrate first surface 104. Also shown, a silicon dioxide layer 204 is interposed between the glass substrate top surface 202 and the Ge substrate first surface 104. To ensure bonding integrity during Ge device fabrication, typically the glass substrate 200 is chosen to have a thermal expansion coefficient of about (5 to 8)$\times 10^{-6}$ K$^{-1}$ at room temperature. Some examples of glass substrate materials include Borosilicate (BK7), 96% Silica (Vycor), soda lime, and dense lanthanum flint (borosilicate with rare earth (RE) elements), also known as LaSFN9.

Figure 3A:
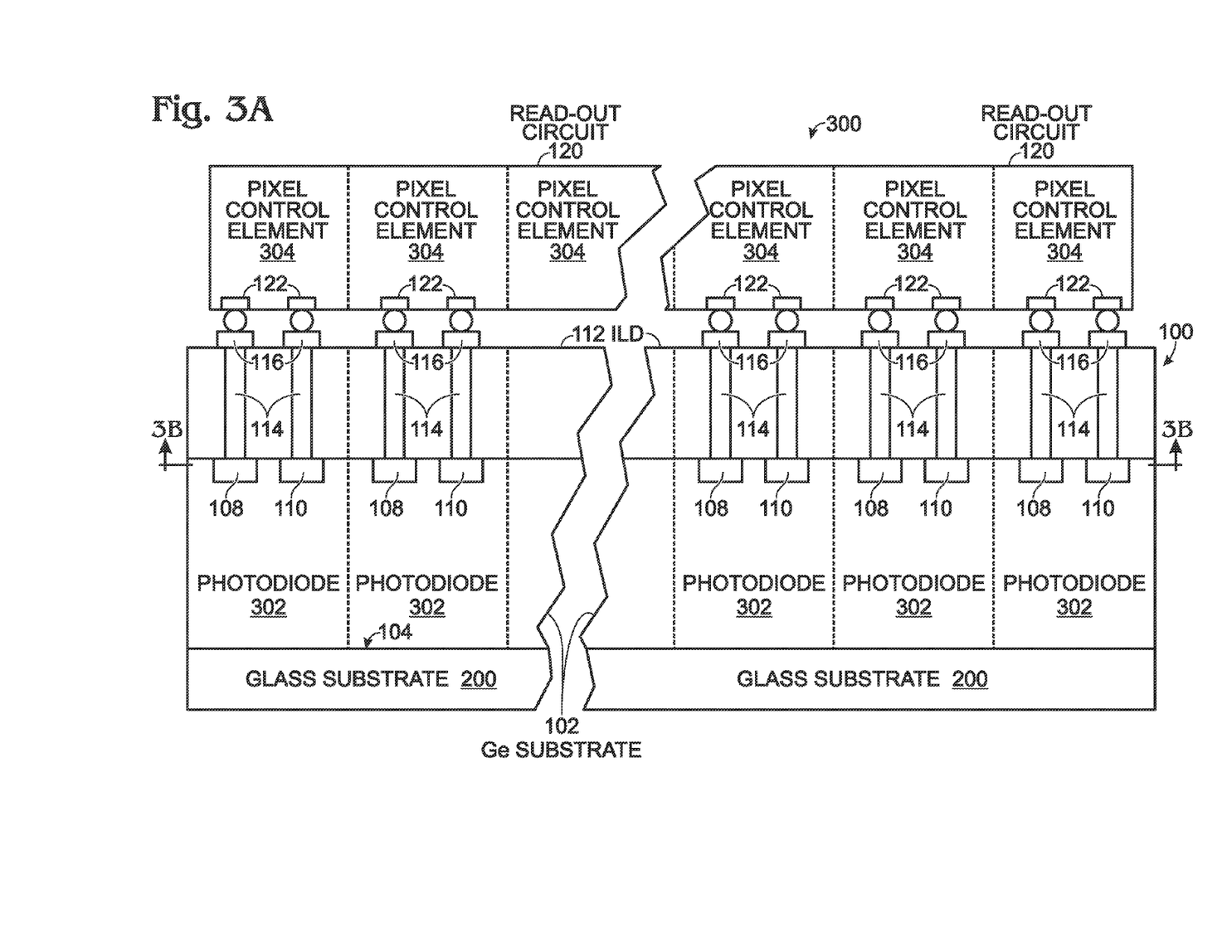
FIG. 3A is a partial cross-sectional view of a Ge image sensor.
Figure 3B:
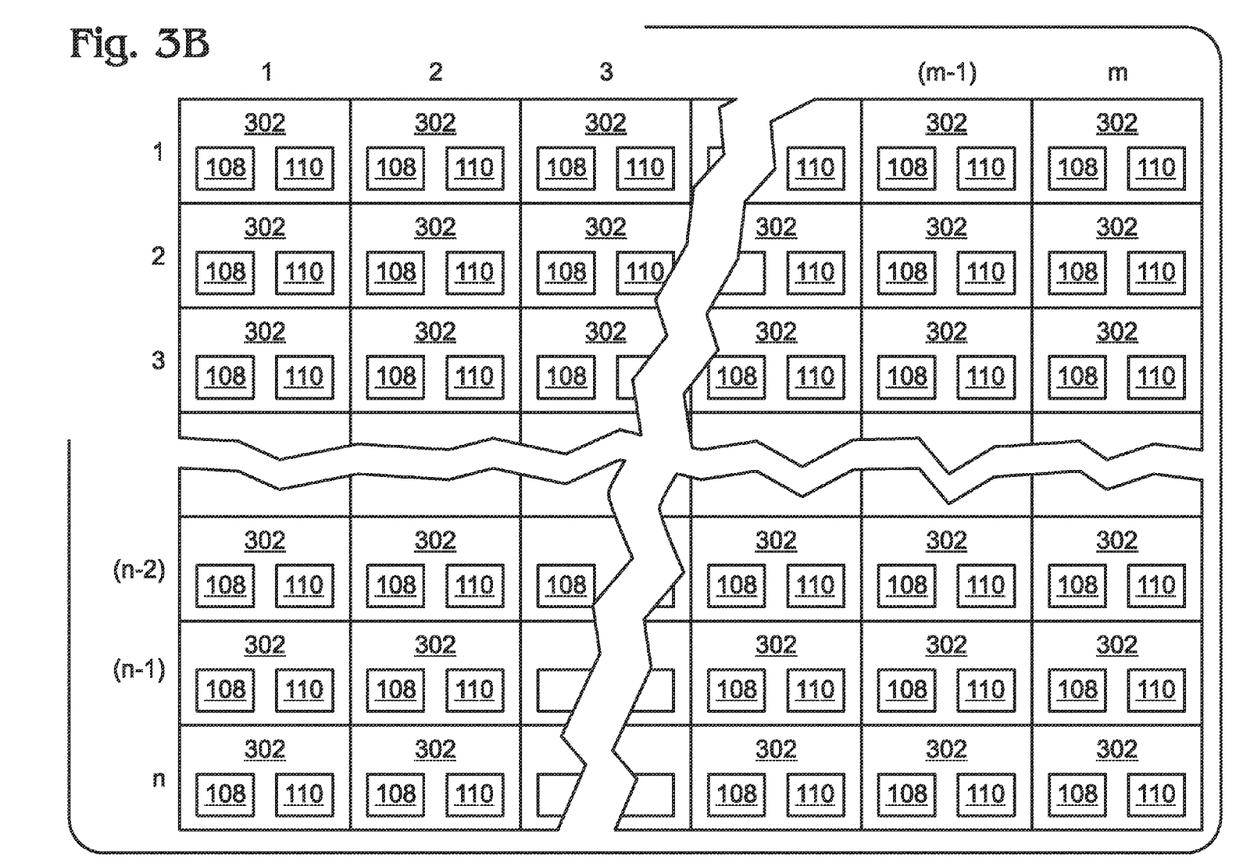
FIG. 3B is a plan view of the Ge substrate second surface as seen without the Si substrate read-out circuitry.

FIG. 3A is a partial cross-sectional view of a Ge image sensor, and FIG. 3B is a plan view of the Ge substrate second surface as seen without the Si substrate read-out circuitry. The array 300 comprises a Ge substrate as described above in the explanation of FIGS. 1 and 2. As above, the Ge substrate 102 is either not doped or lightly doped with a first dopant. The Ge substrate 102 has a first surface 104 moderately doped with the first dopant and a second surface 106 having m columns and n rows of pn photodiodes 302. Each photodiode 302 includes a first region 108 heavily doped with the first dopant, and a second region 110 heavily doped with a second dopant, having an opposite electron affinity than the first dopant and forming a pn junction.

An ILD layer 112 overlies the Ge substrate second surface 106, with metal-filled contact holes 114 overlying the first and second regions 108/110 of each pn photodiode 302 and metal pads 116 overlying the contact holes 114. A silicon (Si) substrate read-out circuit 120 has an array of pixel control elements 304 arranged in m columns and n rows, where electrical contacts 122 for each pixel control element 304 are bonded to the metal pads of a corresponding pn photodiode 302. Some examples of pixel control elements, also known as active pixel sensing (APS) sets, can be found in pending application Ser. No. 12/039,706, entitled CMOS IMAGER FLUSH RESET, invented by Hsu et al., filed on Feb. 2, 2008, which is incorporated herein by reference. A number of APS designs are known in the art, the Si substrate read-out circuit 120 is not limited to any particular type of design. Note: the read-out circuit is referred to as a Si substrate device since almost all conventional ICs and electrical circuits are fabricated using silicon compatible processes. However, the read-out circuit need not necessarily be silicon based.

In one aspect, as shown, a glass substrate 202 has a top surface 204 bonded to the Ge substrate first surface 104. However, in other aspects the glass substrate is not present.

Functional Description

The germanium and silicon thermal expansion coefficients are shown in Table 1. The Ge thermal expansion coefficient is about 2 times higher than that of Si. Ge-to-Si bonding typically occurs at room temperature. After Ge thinning, the Ge film thickness on the Si wafer ranges from 10 nm to 100 microns depending on the Ge device requirement. For thin Ge films (less than 1 micron) formed on Si wafers, high temperature processes in the fabrication of devices on Ge film and the large thermal expansion coefficient difference may not affect the Ge film integrity. However, for thick Ge films (>1 micron), the stress on Ge film is so large that bonding strength cannot withstand the strain on Ge film. The Ge film tends to peel off from the Si wafer, or causes cracking during the wafer cool down.

TABLE 1

| Temperature | Ge Thermal Expansion Coefficient, α ($10^{-6}$ K$^{-1}$) | Si Thermal Expansion Coefficient, α ($10^{-6}$ K$^{-1}$) |
|---|---|---|
| 0 K | 0.00 | 0.0 |
| 200 K | 5.00 | 1.7 |
| 300 K | 5.90 | 2.6 |
| 400 K | 6.39 | 3.2 |
| 500 K | 6.82 | 3.6 |
| 600 K | 7.20 | 3.8 |
| 800 K | 7.88 | 4.1 |

If the Si wafer is just used as a handling wafer and does not provide any functional propose for the device fabricated on Ge, then a glass wafer may be used instead. Glass is a good substitute to use as the handling wafer. Glass can be made of different compositions, and its thermal expansion coefficient depends on the composition. For example, BK7 glass is a relatively hard borosilicate glass that has the thermal expansion coefficient of $7.1\times10^{-6}$K$^{-1}$ at room temperature. The Ge wafer can be bonded on the glass, the Ge can be thinned as a bonded pair, and devices fabricated on the bonded pair. Eventually, the device can be packaged with or without the glass handling wafer.

Table 2 lists some key glass parameters

TABLE 2

| Glass | Description | Thermal Expansion Coefficient, α ($10^{-6}$ K$^{-1}$) | Glass Softening Point (° C.) |
|---|---|---|---|
| BK7 | Borosilicate Glass | 7.1 | 550 |
| Vycor | 96% Silica | 7.5 | 1530 |

TABLE 2-continued

| Glass | Description | Thermal Expansion Coefficient, α ($10^{-6} K^{-1}$) | Glass Softening Point (° C.) |
|---|---|---|---|
| Soda Lime | Soda Lime | 8.6 | 700 |
| LaSFN9 Glass | dense lanthanum flint (borosilicate glasses with RE oxides). | 7.4 | 703 |

The bonding may start with a surface preparation of the Ge wafer and glass wafer. The surface of these two wafers can be coated with a $SiO_2$ film grown by a chemical vapor deposition (CVD) prior to any chemical treatment. The surface of Ge can be treated in hydrophilic or hydrophobic conditions. Similar treatments may be applied to the glass wafer. Additionally, a plasma treatment on wafer surface can also be performed to improve the bonding strength. The bonding can be performed at room temperature or at temperature less than 600° C., in either vacuum or other ambient. After bonding, an optional thermal treatment can be applied to improve the bonding strength. Then, the Ge thinning process starts. The Ge thinning can be done by grinding, polishing, chemical-mechanical polishing, wet etching, and/or dry etching. After that, devices are fabricated on the bonded pair.

Figure 4A:
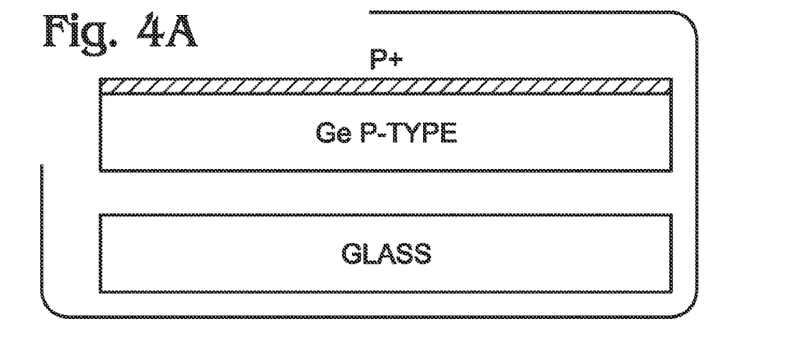
FIGS. 4A through 4H depict steps in the fabrication of a Ge film optical device.

FIGS. 4A through 4H depict steps in the fabrication of a Ge film optical device. In FIG. 4A, the Ge wafer and glass wafer are prepared. The Ge wafer is shown as p-type doped. However, if n-type germanium is used, the doping polarities in the following process are reversed (n to p, p to n). Also as noted above, the Ge substrate may also be undoped. The Ge surface is implanted so as to be moderately p-type doped. The dopant may be boron, and the dopant density is 1E16 Co 5E19.

Figure 4B:
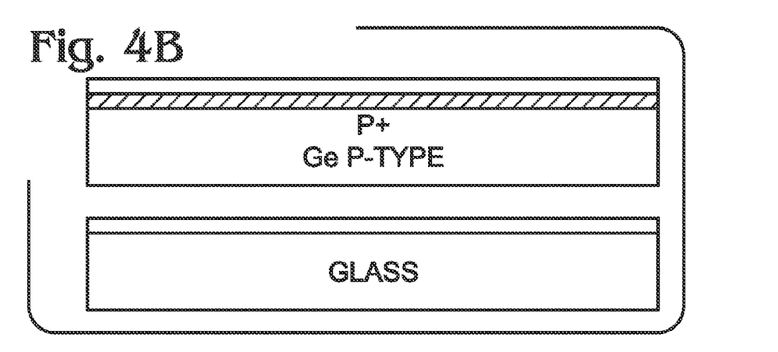

In FIG. 4B, a $SiO_2$ layer is formed on Ge and glass surfaces by CVD deposition. This is an optional process. Also, the $SiO_2$ may only deposited on one of the wafers. A surface treatment on either or both wafers, including a hydrophilic, hydrophobic, or plasma treatment is typically performed.

Figure 4C:
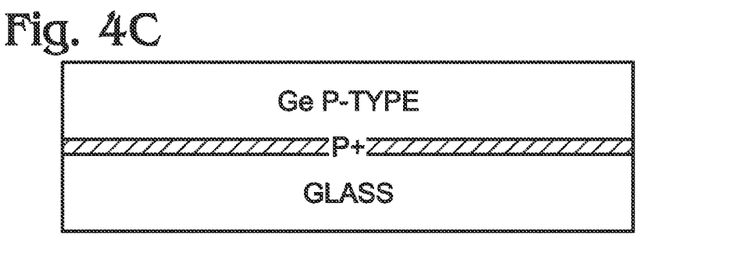

In FIG. 4C the two wafers are bonded together. The bonding can be performed at room temperature or at temperature less than 600° C., in either vacuum or other ambient. After bonding, an optional thermal treatment is applied to improve the bonding strength. The optional $SiO_2$ bonding interface mentioned above in the description of FIG. 4B is not shown for improved clarity.

Figure 4D:
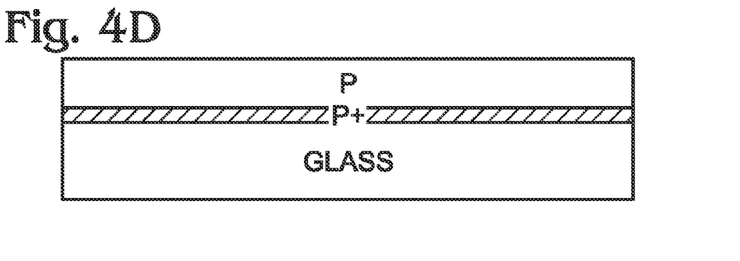

In FIG. 4D Ge thinning is performed by grinding, polishing, chemical-mechanical polishing, wet etching, and/or dry etching. The resultant Ge film thickness is between 1 micron and 100 microns. In some cases, no Ge thinning is required.

Figure 4E:
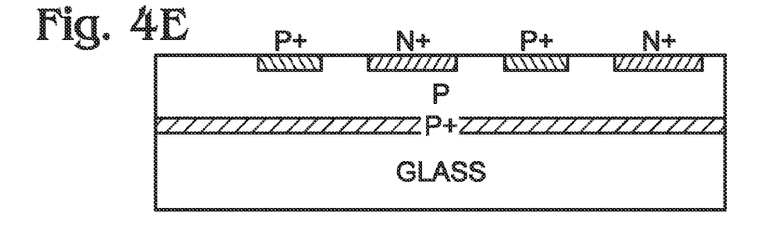

In FIG. 4E, phosphorous (or arsenic) and boron are implanted into germanium to form the N+ and P+ regions, respectively. The dopant concentrations for N+ and P+ regions are 5E18 to 1E21. Dopant activation is performed at 400° C. to 600° C., for 1 second to 10 hours.

Figure 4F:
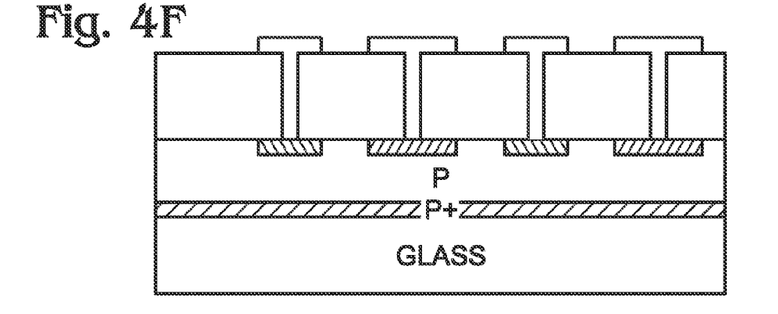

In FIG. 4F a $SiO_2$ ILD layer is formed by CVD deposition. Contact holes are etched and metal pads are formed. In the case of an infrared (IR) imager, one level of metal is enough. However, other types of Ge devices may require a multi-level metal process, which is performed on the bonded pair in this step.

Figure 4G:
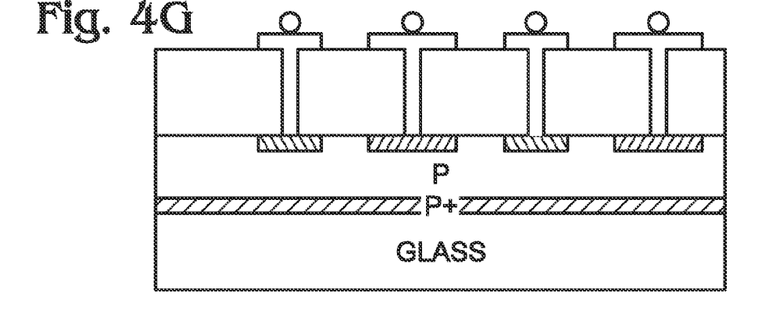

In FIG. 4G metal balls, or any other type of conducting material, is fabricated on the metal pads. The wafer may be flip bonded to a silicon read-out IC wafer in a conventional manner. The bonding can be done at chip level or at the wafer level.

Figure 4H:
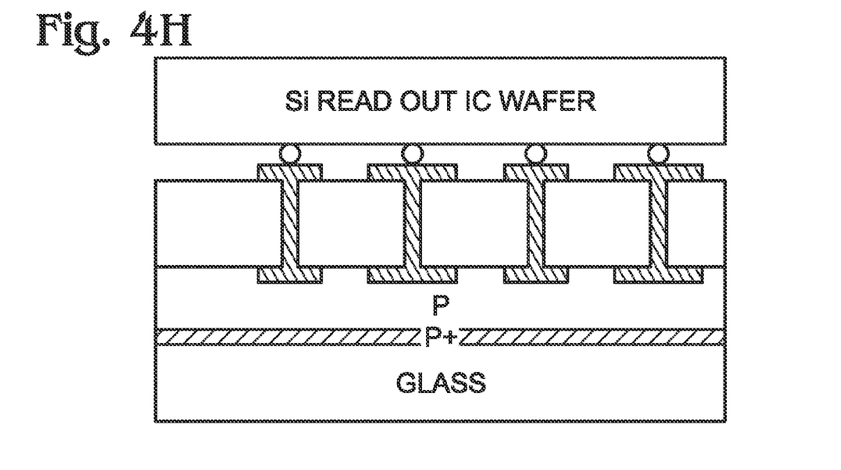

FIG. 4H depicts the device after package bonding the Ge-on-glass wafer to a Si read-out IC (ROIC) wafer. The ROIC wafer may include a pixel control circuit array and peripheral circuits, such as multiplexers, X- and Y-shift registers, column amplifiers, and A/D converters, which are fabricated to surround the pixel control circuit array.

The glass is no longer need to handle the Ge film and may be removed. However, since IR can penetrate the glass, the glass removal step is not required. In a Ge short wavelength IR imager, the Ge detects IR at wavelengths between 1000 nm to 1600 nm. Therefore, it is important not only to select the glass to have a thermal expansion coefficient close to Ge, but also a glass that is transparent to IR at the wavelengths of interest. For a BK7 borosilicate glass, a 10 mm thickness of glass has more than 94% transmission at IR wavelengths. Additionally, Ge has strong absorption in the wavelengths shorter than 1000 nm and can, therefore, be used for visible light imager application. The wafer is diced out to chip.

The moderately p-type surface doped layer is very important in the device function. As IR light penetrates through the glass side, electrons and holes are generated very close to the glass/Ge interface. Any interface defect acts as a recombination center, and causes leakage current and lower sensitivity. The moderately doped region creates a surface field that prevents electrons from moving towards the interface. This effectively reduces the recombination and improves the device performance.

The Ge imager described above has a common potential on the p-type Ge region. In the example depicted in FIGS. 4A through 4H, the p+ (first) regions act as a "ground" pad. However, it is not necessary to have metal pad to connect to p+ region for every pixel. The p+ first region, p substrate, and bottom p+ surface are all electrically connected, and a metal pad connecting to single p+ first region may be sufficient to ground several adjacent pixels. The n-type doped region defines the pixel of the IR imager. Each n-type region is connected to a separated read out circuit built in the silicon wafer.

In the case of a Ge IR imager, the sensor is simple pn junction, and one metal process is sufficient. However, a Ge IR imager can also be made as a two metal layer device. The first layer metal (M1) connects all the p+ regions, and the second layer is made of individual metal pads, where each pad connects to the n+ region of a corresponding pixel. Every chip needs only one p+ (grounding pad), since M1 connects all p+ regions. In this case, the Si read-out chip has a common ground on the peripheral of the array. One metal pad for every pixel of the read-out is electrically connected to the Ge n+ region of a corresponding pixel. The common ground of the Si read-out and Ge diode array are also connected at the outside of the array. The advantage of this configuration is that the flip chip bonding (to the Si ROIC) is much easier. For the flip chip bonding process, alignment between the Si ROIC and the Ge device is critical. Furthermore, it is difficult to make the metal ball size small. In this two-metal process, each pixel has only one metal pad and one metal ball, so the flip chip bonding process is much easier than the case where each pixel needs two metal pads and two metal balls.

Figure 5:
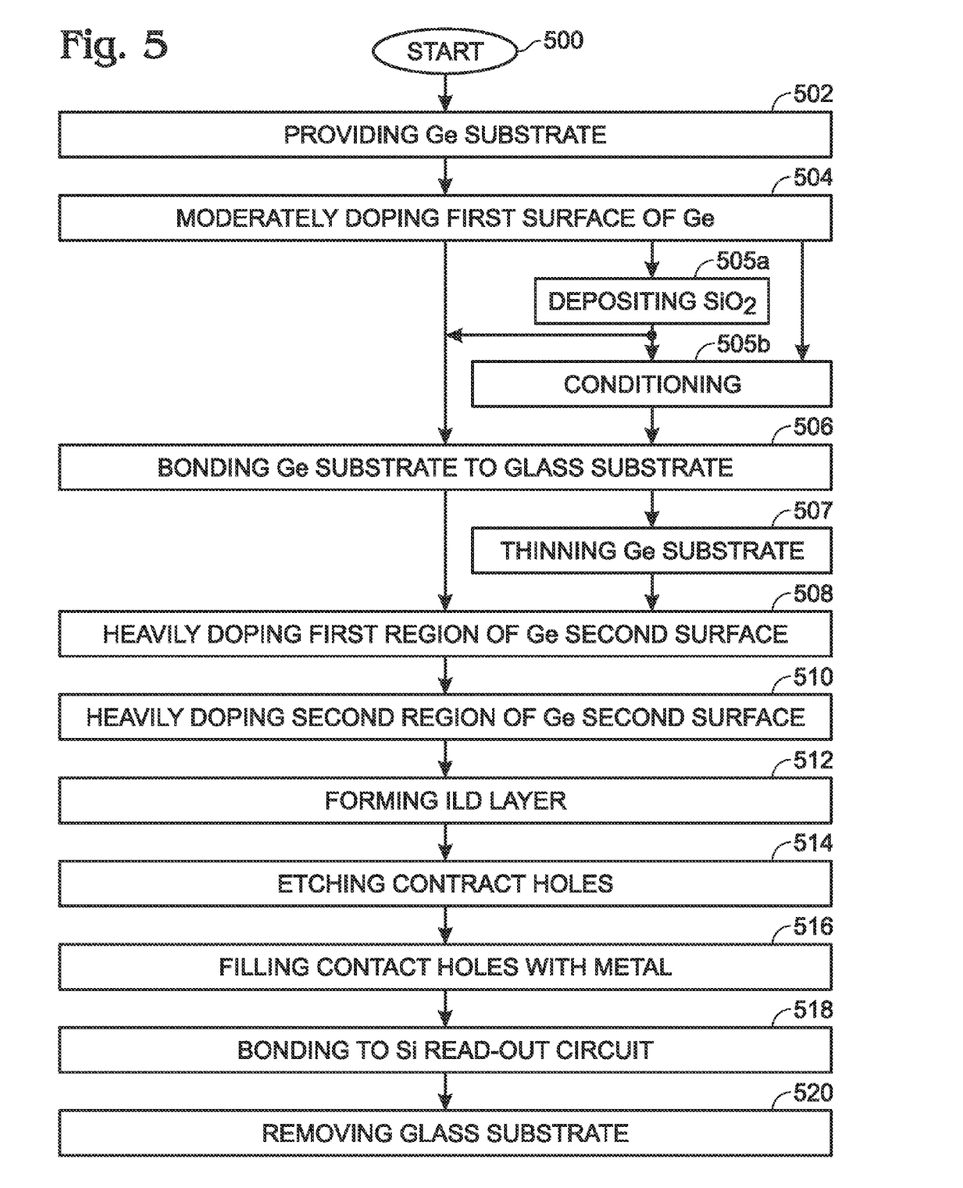
FIG. 5 is a flowchart illustrating a method for fabricating a Ge photodiode array on a glass substrate.

FIG. 5 is a flowchart illustrating a method for fabricating a Ge photodiode array on a glass substrate. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 500.

Step 502 provides a Ge substrate that is either non-doped or lightly doped with an n or p first dopant. The Ge substrate has a first surface and a second surface. Step 504 moderately dopes the first surface of the Ge substrate with the first dopant. Step 506 bonds the first surface of the Ge substrate to a glass substrate top surface. Step 508 heavily dopes a first region of the Ge substrate second surface with the first dopant. Step 510 heavily dopes a second region of the Ge substrate second surface with a second dopant, having an opposite electron affinity than the first dopant, forming a pn junction. Step 512 forms an ILD layer overlying the Ge substrate second surface. Step 514 etches contact holes in the ILD layer overlying the first and second regions of Ge substrate second surface. Step 516 fills the contact holes with metal and forms metal pads overlying the contact holes.

In one aspect, heavily doping the first region of the Ge Substrate second surface (Step 508) and heavily doping the second region of the Ge substrate second surface (Step 510) includes forming an m column by n row array of pn photodiodes. A further step, Step 518 bonds the metal pads of the pn photodiode array to electrical contacts on a Si substrate read-out circuit having an array of pixel control elements arranged in m columns and n rows. Each pixel control element reads and resets a corresponding Ge photodiode. In another aspect, subsequent to bonding the metal pads to the electrical contacts of the silicon substrate photodiode read-out circuit, Step 520 removes the glass substrate.

In another aspect prior to bonding the Ge substrate to the glass substrate, Step 505a deposits a silicon dioxide layer on the glass substrate top surface, the Ge substrate first surface, or both the glass substrate top surface and Ge substrate first surface.

In one aspect, prior to bonding the Ge substrate to the glass substrate (Step 506), Step 505b conditions the glass substrate top surface, the Ge substrate first surface, or both the glass substrate top surface and Ge substrate first surface. The conditioning is performed using hydrophilic, hydrophobic, or plasma treatments.

In one aspect, subsequent to bonding the Ge substrate to the glass substrate, Step 507 thins the Ge substrate to a thickness in the range of about 1 to 100 microns. The thinning may be performed using a mechanical polishing, chemical-mechanical polishing (CMP), wet etching, or dry etching process.

In another aspect, doping the first surface of the Ge substrate with the first dopant in Step 504 includes doping with a density in a range of $1\times10^{19}$ to $5\times10^{19}$ cm$^{-3}$. Heavily doping the first and second regions of the Ge substrate second surface in Steps 508 and 510 includes: doping with a density in the range of $5\times10^{18}$ to $1\times10^{21}$ cm$^{-3}$; and, activating at a temperature in the range of 400 to 600 degrees C., for a duration in the range of 1 second to 10 hours.

In one aspect, bonding the first surface of the Ge substrate to the glass substrate top surface in Step 506 includes bonding the Ge substrate to a glass substrate having a thermal expansion coefficient of about (5 to 8)$\times10^{-6}$ K$^{-1}$ at room temperature. Typically, the first surface of the Ge substrate is bonded to the glass substrate top surface at a temperature in the range of about 25 to 600 degrees C., in either a vacuum or ambient (e.g., room temperature, normal atmosphere) environment.

A Ge photodiode array on a glass substrate has been provided with a corresponding fabrication method. Examples of particular materials and process steps have been given to illustrate the invention. However, the invention is not limited to merely these examples. Further, the invention was presented in the context of a Ge imager, but the invention has application to any kind of device or circuitry that can be fabricated in Ge. Other variations and embodiments of the invention will occur to those skilled in the art.

We claim:

1. A germanium (Ge) film optical device, the device comprising:
a Ge substrate selected from a group consisting of non-doped and lightly doped with a first dopant selected from a group consisting of n and p type dopants, the Ge substrate having a first surface moderately doped with the first dopant and a second surface with a first region heavily doped with the first dopant, and a second. region heavily doped with a second dopant, having an opposite electron affinity than the first dopant and forming a pn junction; and,
an interlevel dielectric (ILD) layer overlying the Ge substrate second surface, with metal-filled contact holes overlying the first and second regions of the Ge substrate second surface and metal pads overlying the contact holes.

2. The device of claim 1 further comprising:
a glass substrate having a top surface bonded to the Ge substrate first surface.

3. The device of claim 2 further comprising:
a silicon dioxide layer interposed between the glass substrate top surface and the Ge substrate first surface.

4. The device of claim 2 wherein the glass substrate has a thermal expansion coefficient of about (5 to 8)$\times10^{-6}$ K$^{-1}$ at room temperature.

5. The device of claim 1 wherein the Ge substrate has a thickness in a range of about 1 to 100 microns.

6. The device of claim 1 wherein the Ge substrate first surface has a doping density in a range of $1\times10^{16}$ to $5\times10^{18}$ cm$^{-3}$.

7. The device of claim 1 wherein the first and second regions of the Ge substrate second surface each have doping densities in a range of $5\times10^{18}$ to $1\times10^{21}$ cm$^{-3}$.

8. The device of claim 1 further comprising:
a silicon substrate photodiode read-out circuit having electrical contacts bonded to the metal pads.

9. A germanium (Ge) image sensor array comprising:
a Ge substrate selected from a group consisting of non-doped and lightly doped with a first dopant selected from a group consisting of n and p type dopants, the Ge substrate having a first surface moderately doped with the first dopant and a second surface having m columns and n rows of pn photodiodes, where each photodiode includes a first region heavily doped with the first dopant, and a second region heavily doped with a second dopant, having an opposite electron affinity than the first dopant and forming a pn junction;
an interlevel dielectric (ILD) layer overlying the Ge substrate second surface, with metal-filled contact holes overlying the first and second regions of each pn photodiode and metal pads overlying the contact holes; and,
a silicon (Si) substrate read-out circuit having an array of pixel control elements arranged in m columns and n rows, where electrical contacts for each pixel control element are bonded to the metal pads of a corresponding pn photodiode.

10. The image sensor array of claim 9 further comprises:
a glass substrate having a top surface bonded to the Ge substrate first surface.

* * * * *